(12) United States Patent
Rhee et al.

(10) Patent No.: US 12,471,421 B2
(45) Date of Patent: Nov. 11, 2025

(54) DISPLAY APPARATUS USING SEMICONDUCTOR LIGHT EMITTING DEVICE

(71) Applicant: LG ELECTRONICS INC., Seoul (KR)

(72) Inventors: Byungjoon Rhee, Seoul (KR); Kyoungtae Wi, Seoul (KR)

(73) Assignee: LG ELECTRONICS INC., Seoul (KR)

(*) Notice: Subject to any disclaimer, the term of this patent is extended or adjusted under 35 U.S.C. 154(b) by 664 days.

(21) Appl. No.: 17/780,909

(22) PCT Filed: Jan. 23, 2020

(86) PCT No.: PCT/KR2020/001185
§ 371 (c)(1),
(2) Date: May 27, 2022

(87) PCT Pub. No.: WO2021/107267
PCT Pub. Date: Jun. 3, 2021

(65) Prior Publication Data
US 2023/0017298 A1   Jan. 19, 2023

(30) Foreign Application Priority Data

Nov. 29, 2019   (KR) .................. 10-2019-0157438

(51) Int. Cl.
*H01L 25/075* (2006.01)
*H10H 20/01* (2025.01)
(Continued)

(52) U.S. Cl.
CPC ....... *H10H 20/857* (2025.01); *H01L 25/0753* (2013.01); *H10H 20/018* (2025.01);
(Continued)

(58) Field of Classification Search
CPC .... H10L 25/167; H10H 29/10; H10H 29/142; H10H 29/20; H10H 29/30; H10H 29/362
(Continued)

(56) References Cited

U.S. PATENT DOCUMENTS

2019/0081025 A1   3/2019   Chang et al.
2019/0157537 A1   5/2019   Namiki et al.
(Continued)

FOREIGN PATENT DOCUMENTS

EP   4 068 368 A1   10/2022
JP   2014-229676 A   12/2014
(Continued)

*Primary Examiner* — Hoai V Pham
(74) *Attorney, Agent, or Firm* — Birch, Stewart, Kolasch & Birch, LLP

(57) ABSTRACT

Discussed is a display device and a method for manufacturing the display device, where the display device includes a substrate, a wiring electrode disposed on the substrate, semiconductor light emitting devices electrically connected to the wiring electrode, an anisotropic conductive layer disposed between the semiconductor light emitting devices and includes conductive particles and an insulating material, and a light-transmitting layer formed between the semiconductor light emitting devices, where the semiconductor light emitting devices includes first semiconductor light emitting devices emitting a first color and second semiconductor light emitting devices emitting a second color different from the first color, and where the first and second semiconductor light emitting devices are alternately disposed with each other.

13 Claims, 16 Drawing Sheets

(51) Int. Cl.
   *H10H 20/831* (2025.01)
   *H10H 20/857* (2025.01)
(52) U.S. Cl.
   CPC ....... *H10H 20/8312* (2025.01); *H10H 20/032* (2025.01); *H10H 20/0364* (2025.01)
(58) Field of Classification Search
   USPC ..................................................... 257/79, 89
   See application file for complete search history.

(56) References Cited

U.S. PATENT DOCUMENTS

2019/0326274 A1* 10/2019 Lee .......................... H01L 25/18
2021/0062989 A1   3/2021 Joe
2022/0406982 A1  12/2022 Choi

FOREIGN PATENT DOCUMENTS

| | | |
|---|---|---|
| JP | 2018-181942 A | 11/2018 |
| KR | 10-2018-0006785 A | 1/2018 |
| KR | 10-2018-0008185 A | 1/2018 |
| KR | 10-2018-0055549 A | 5/2018 |
| WO | WO 2014/140796 A1 | 9/2014 |
| WO | WO 2019/135421 A1 | 7/2019 |

* cited by examiner

[FIG.1]
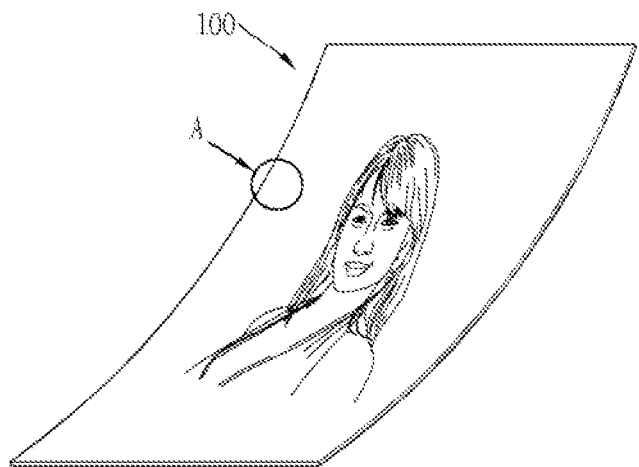
[FIG.2]
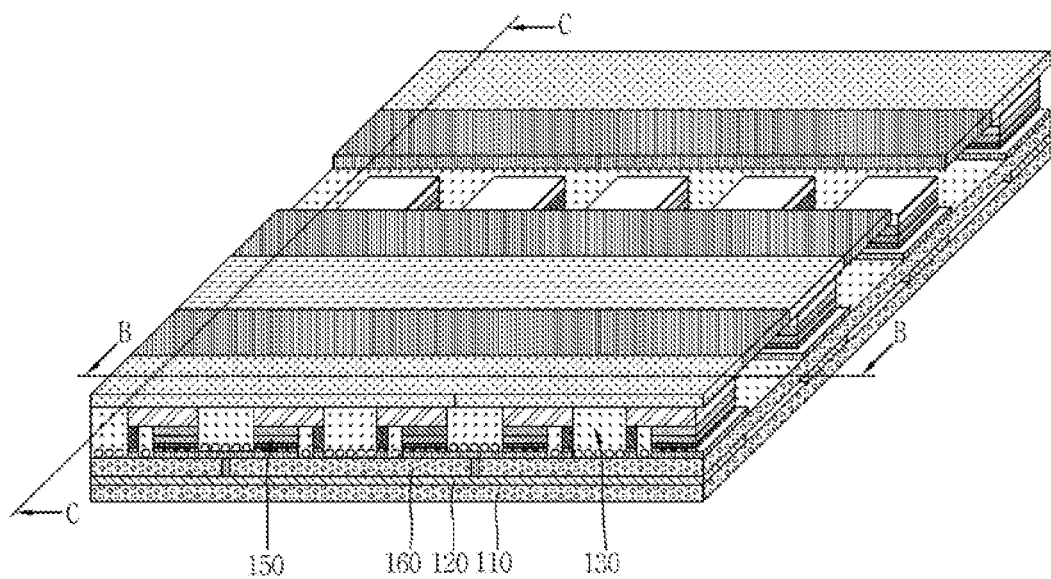

[FIG.3a]
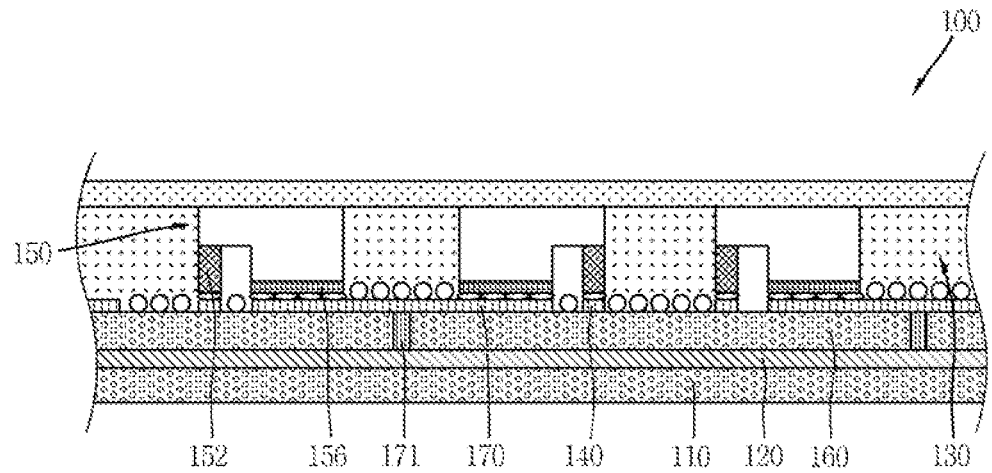
[FIG.3b]
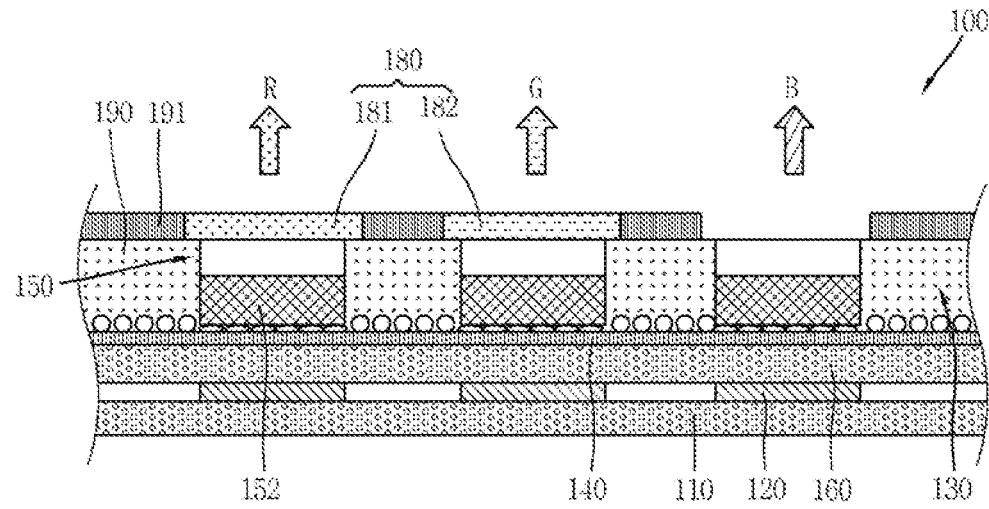

[FIG.4]
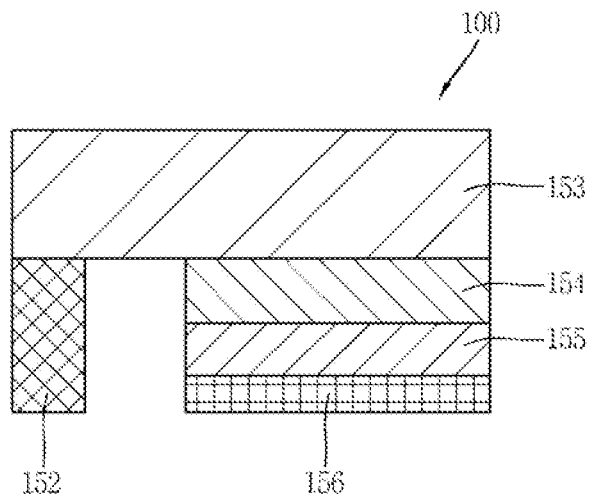
[FIG.5a]
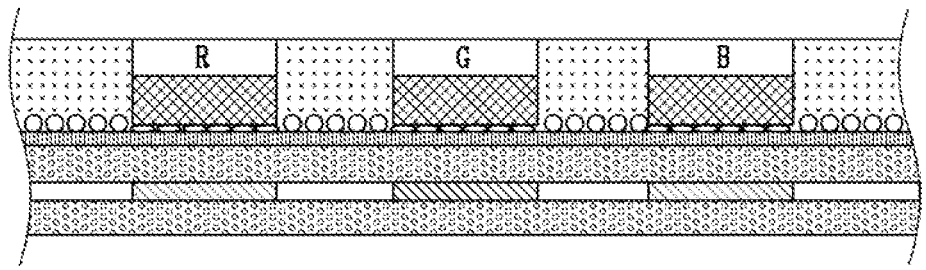
[FIG.5b]
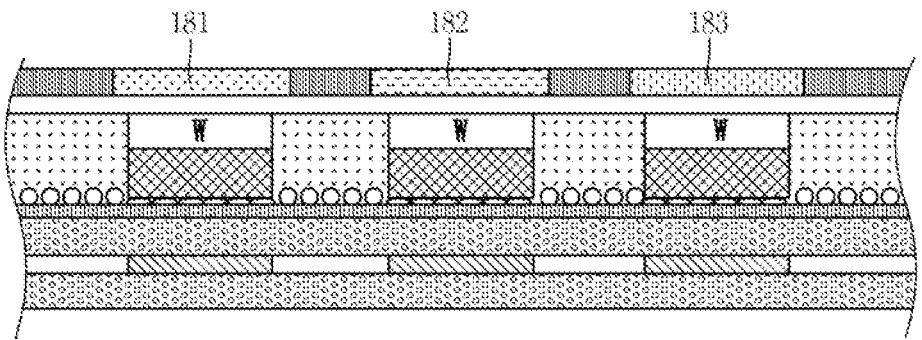

[FIG.5c]
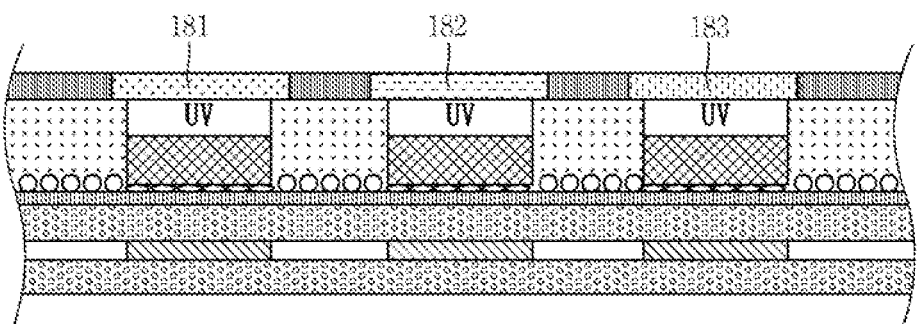

[FIG.6]
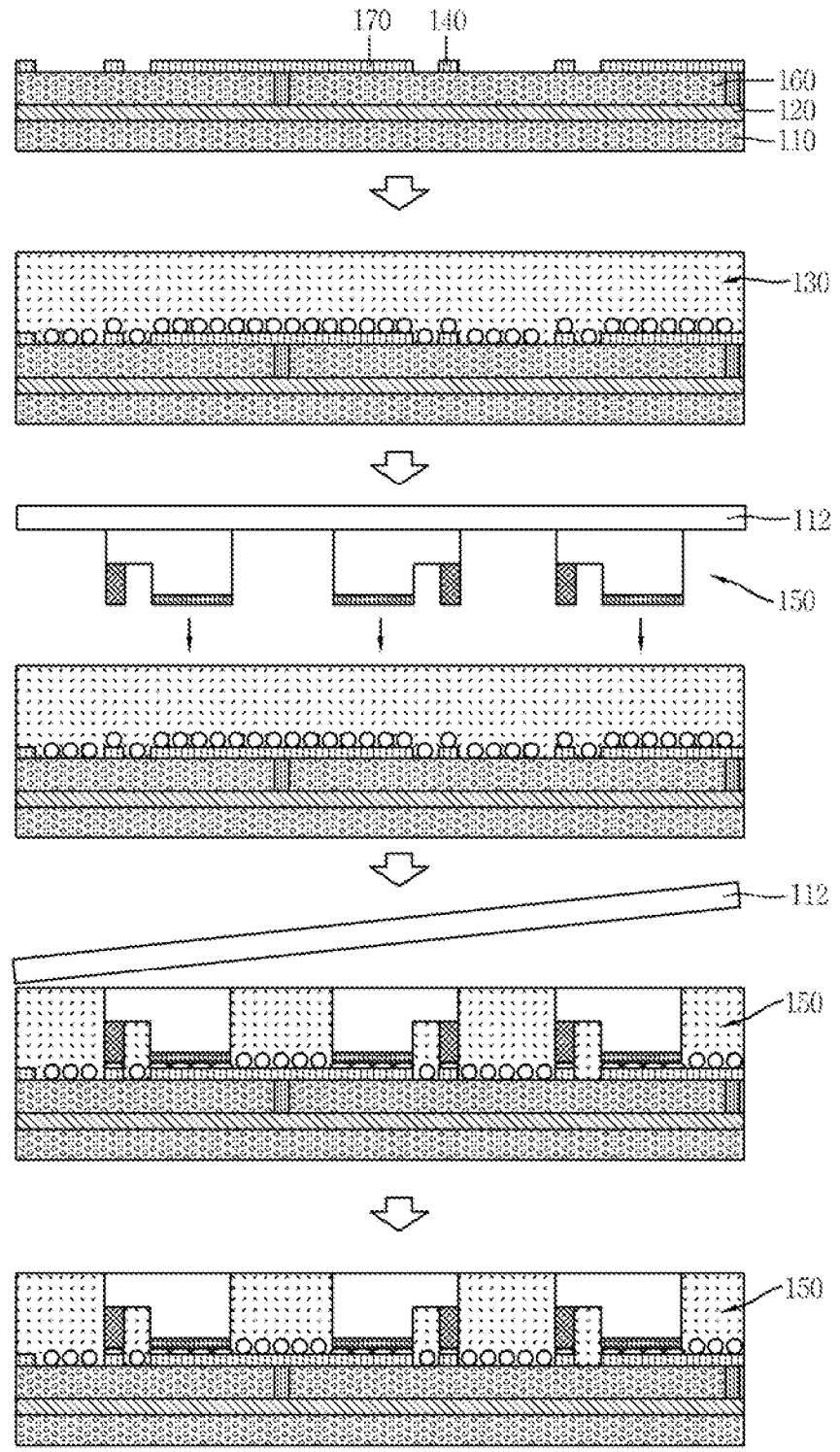

[FIG.7]
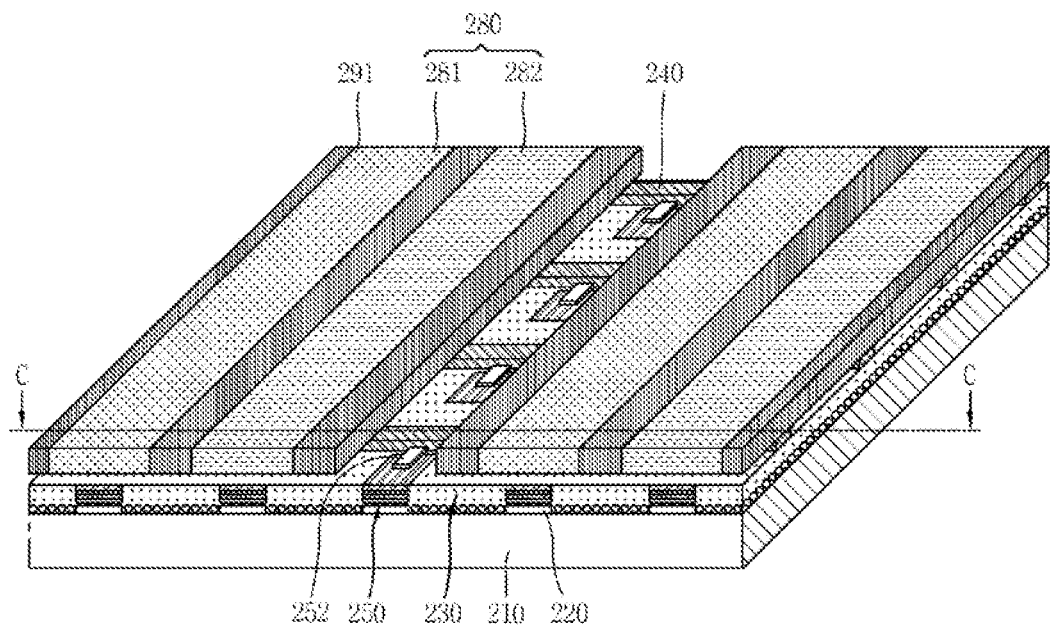
[FIG.8]
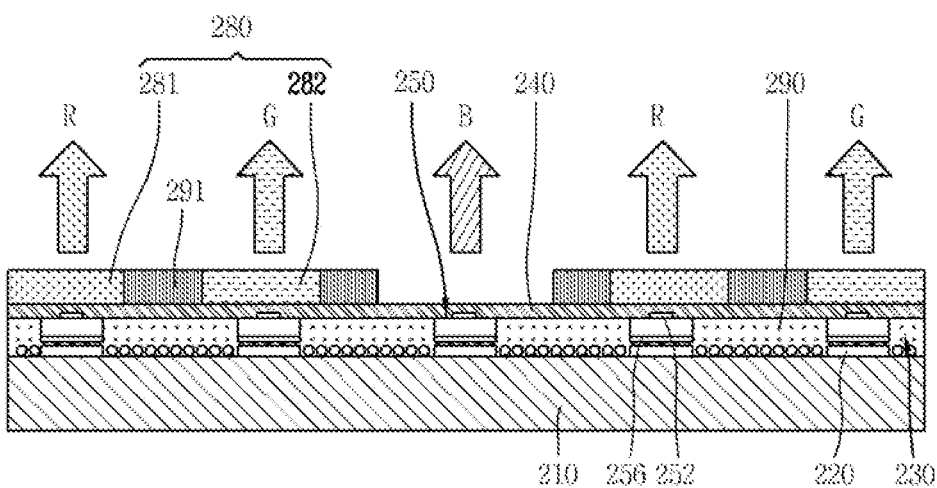

[FIG.9]
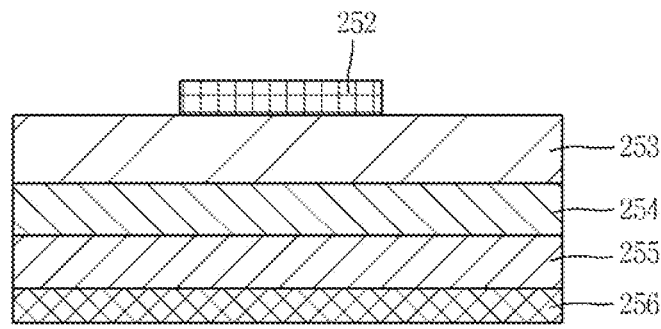
[FIG.10]
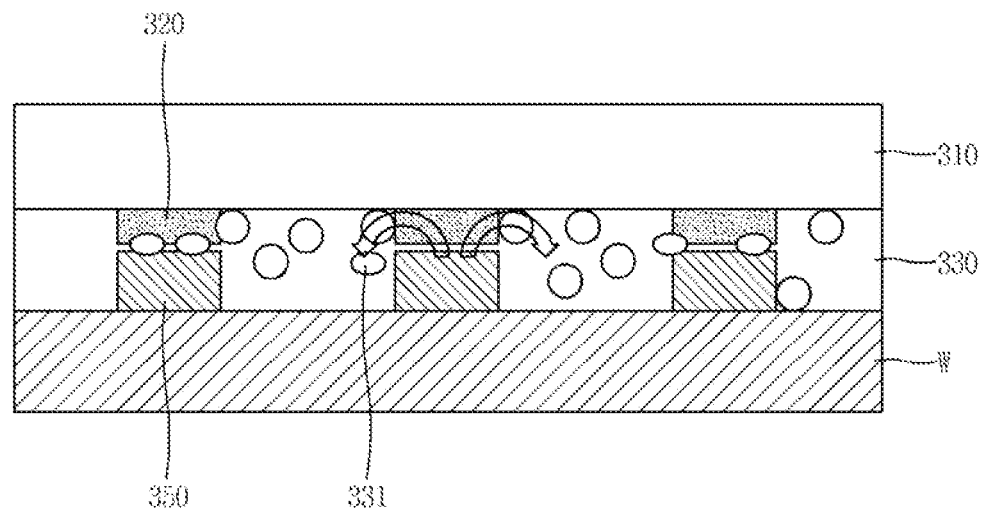
[FIG.11]
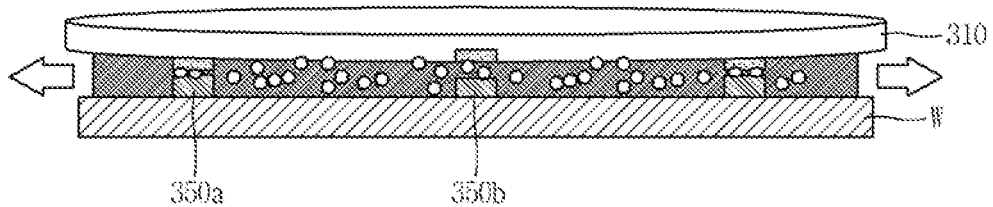

[FIG.12]
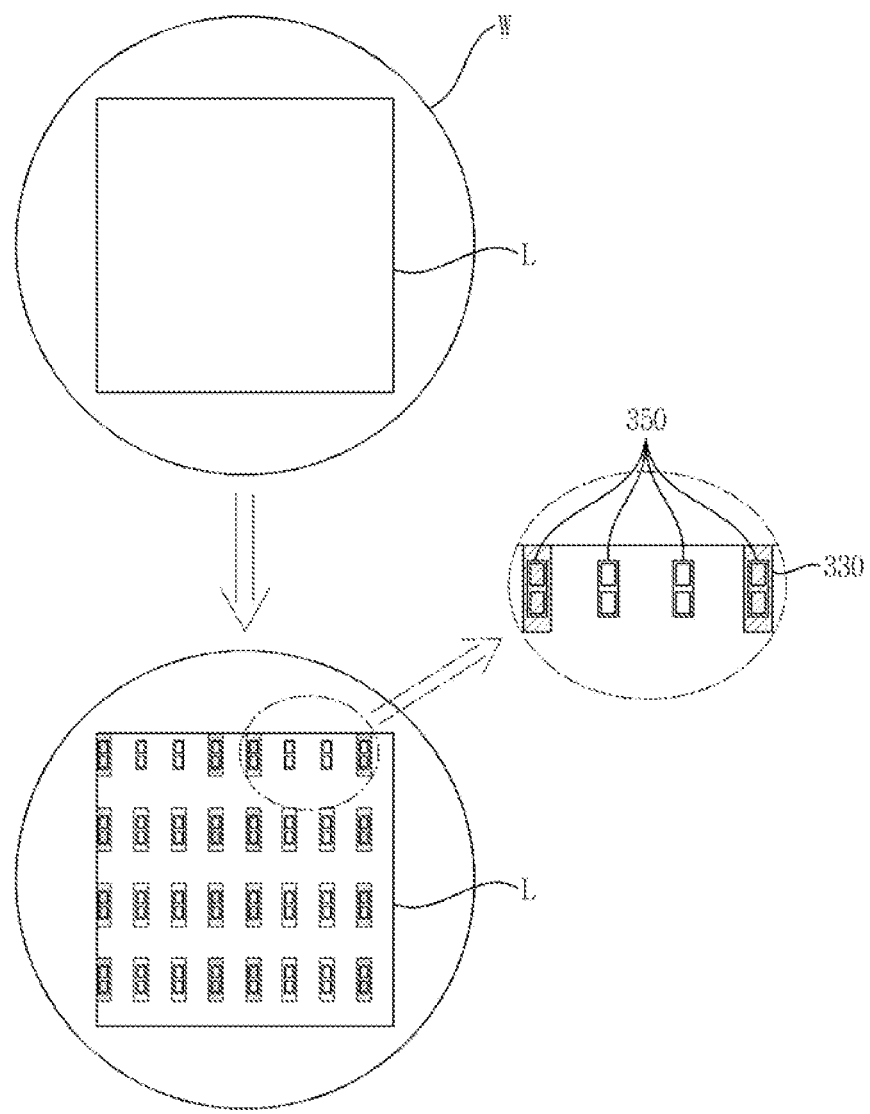

[FIG.13]
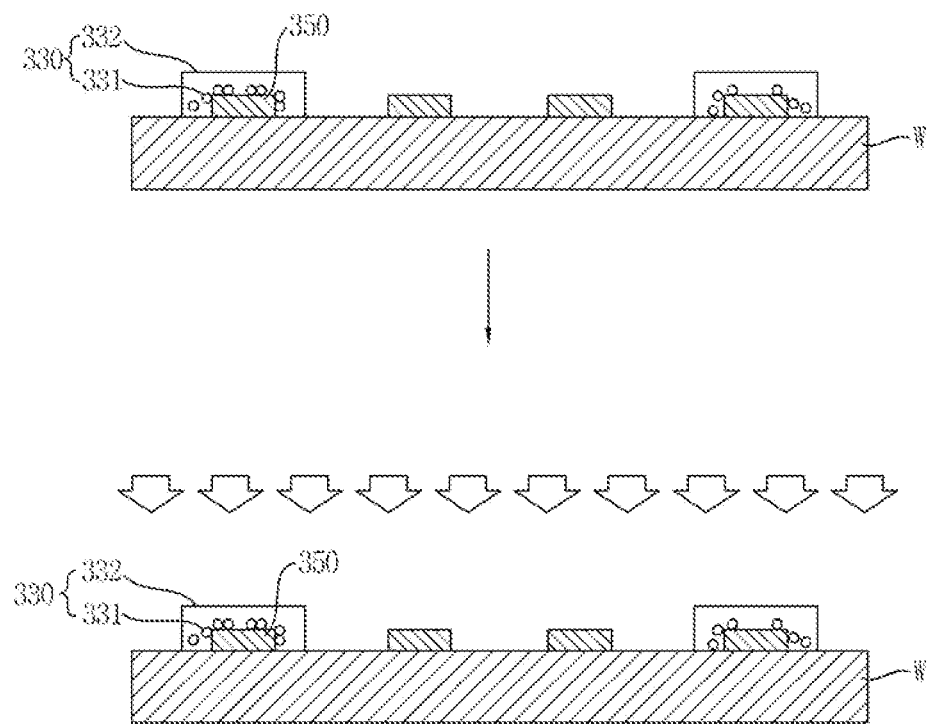

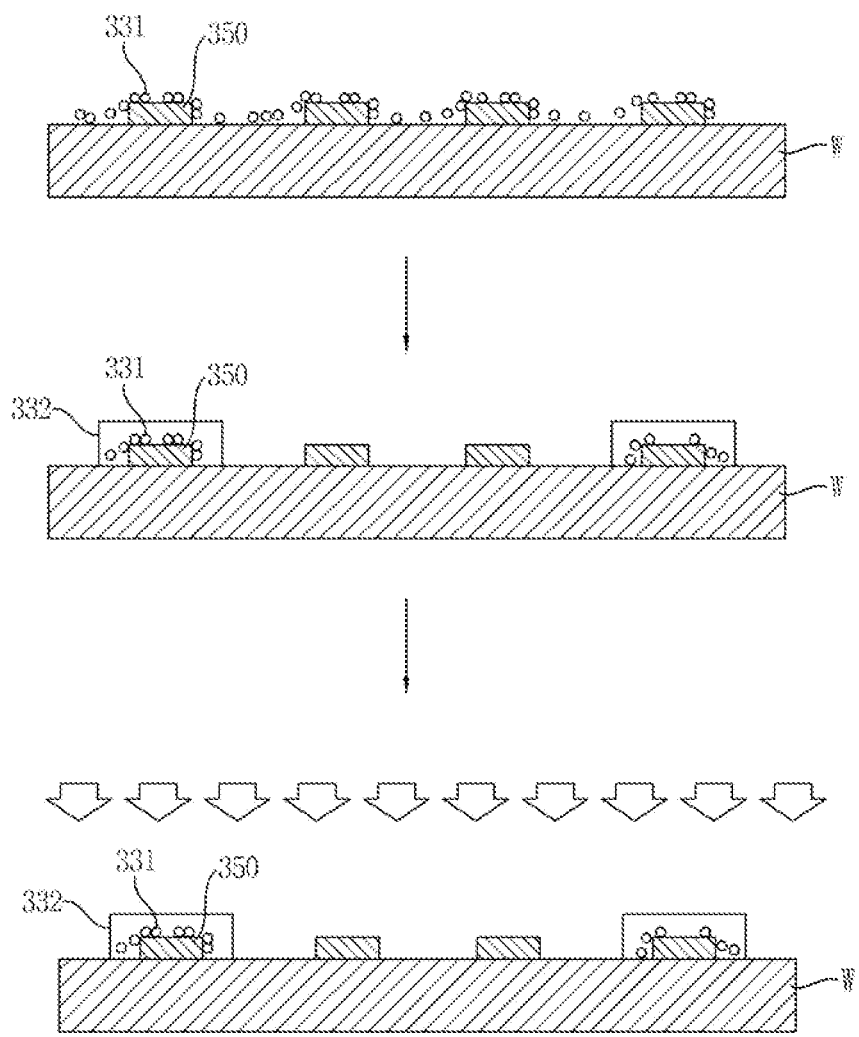
[FIG.14]

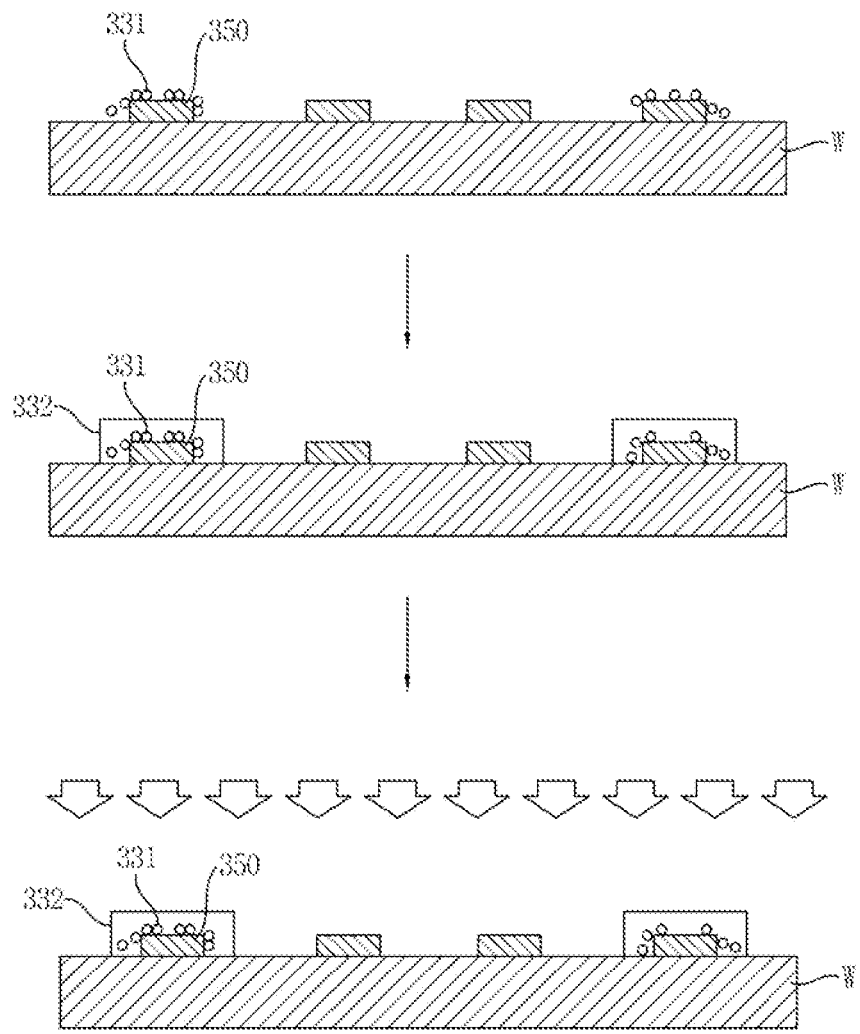
[FIG.15]

[FIG.16]
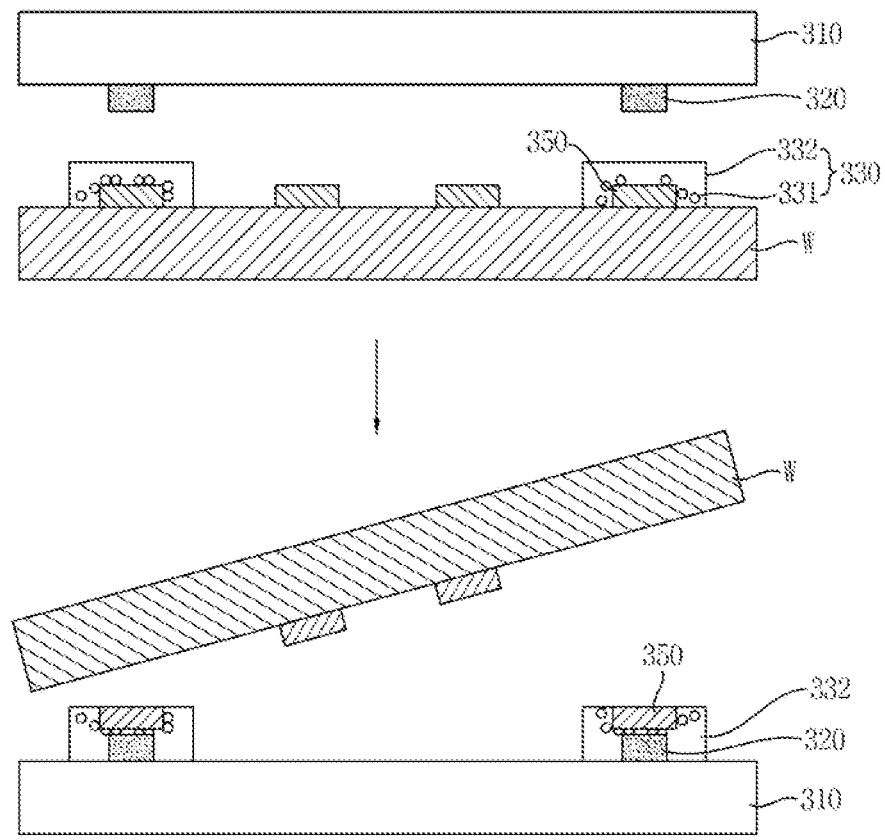

[FIG.17]
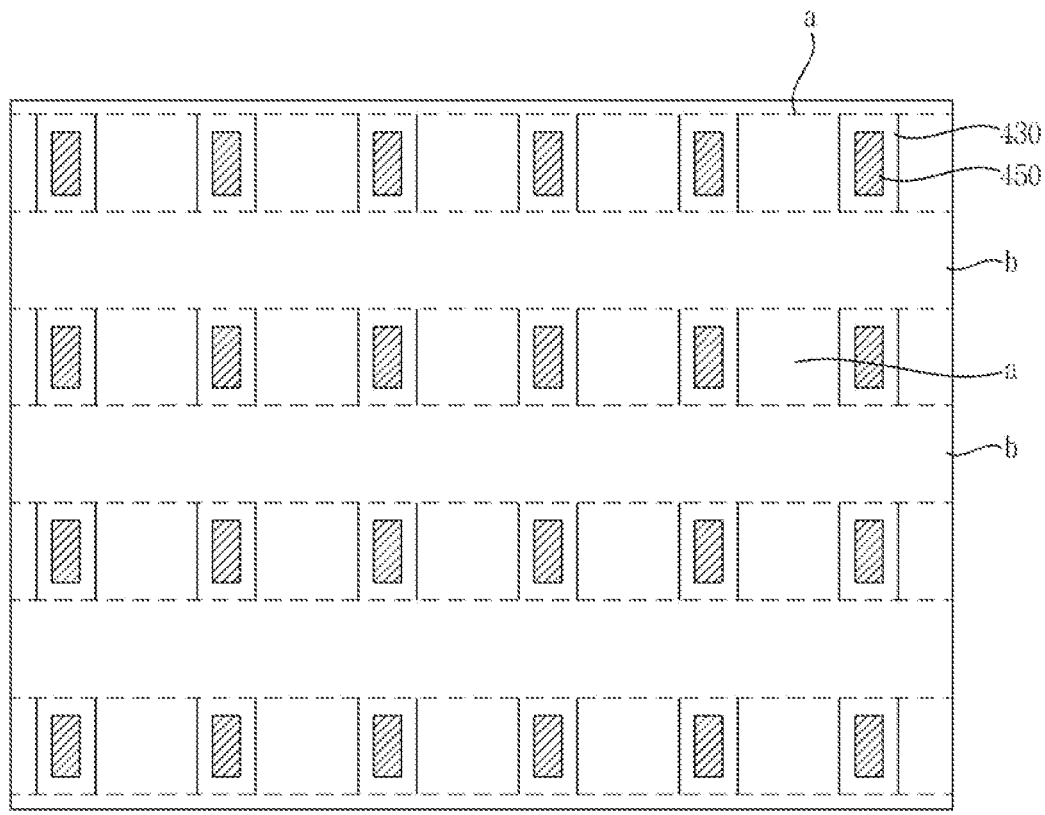

[FIG.18]
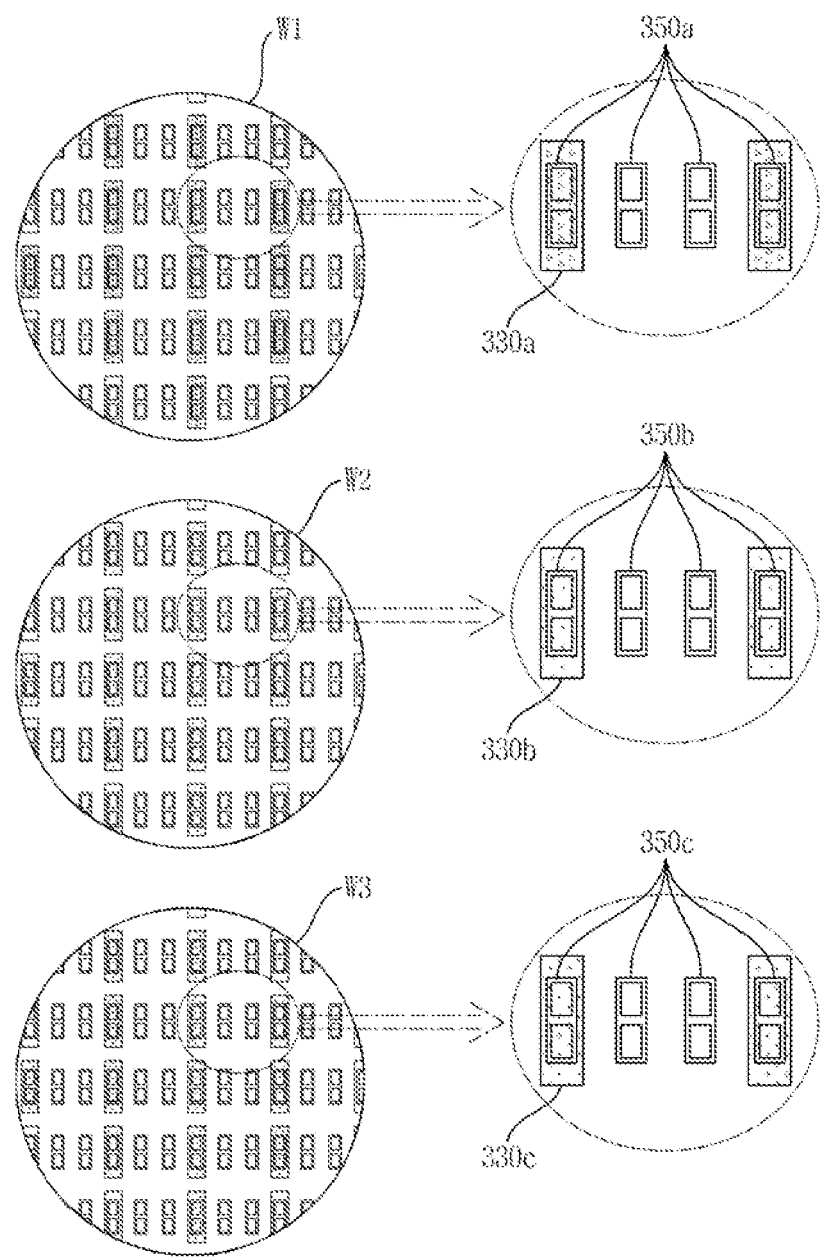

[FIG.19]
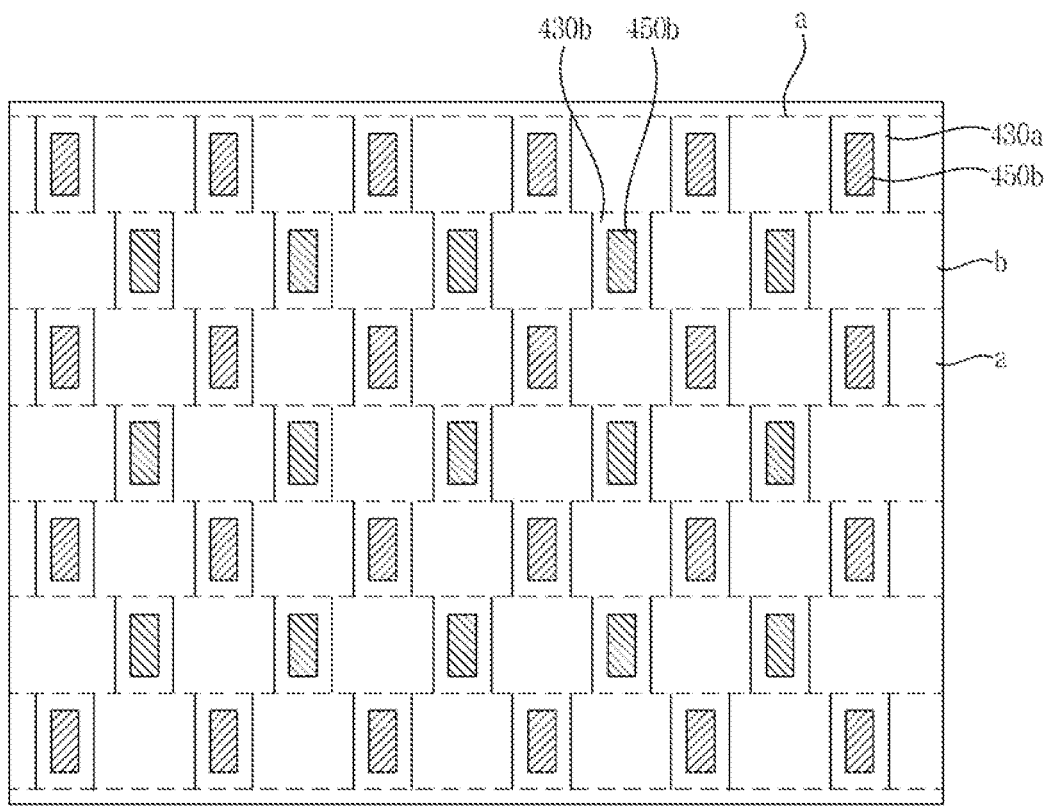

[FIG.20]
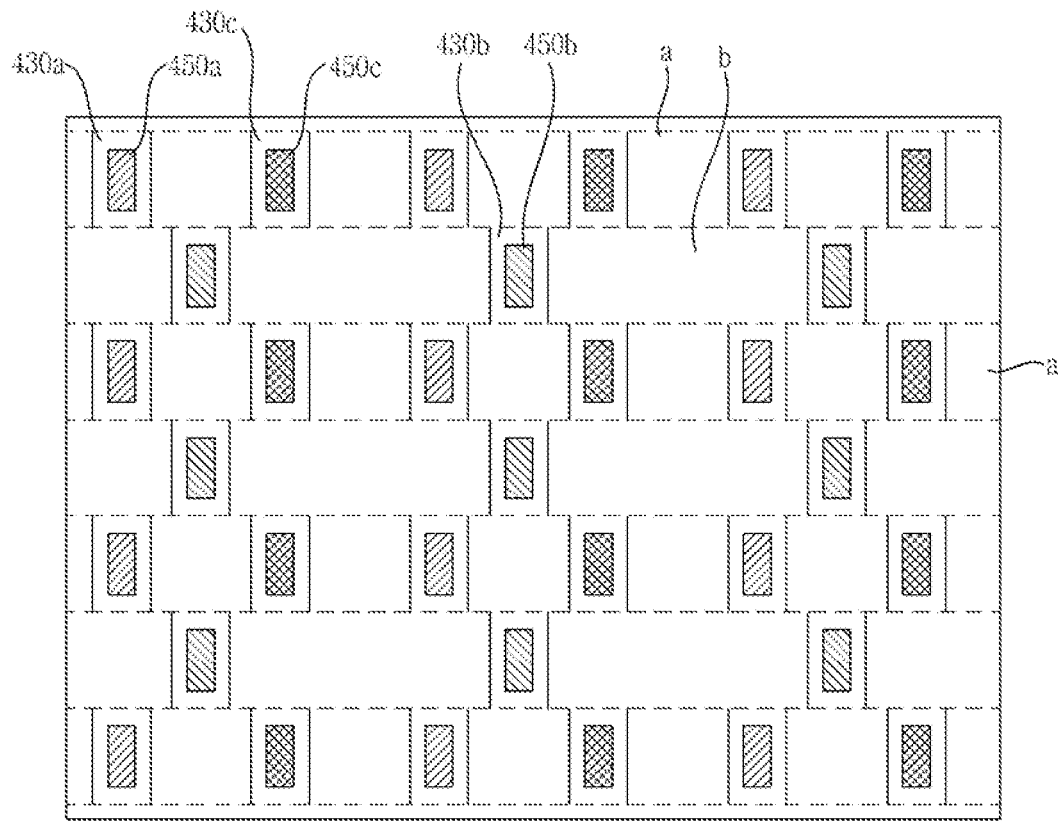
[FIG.21]
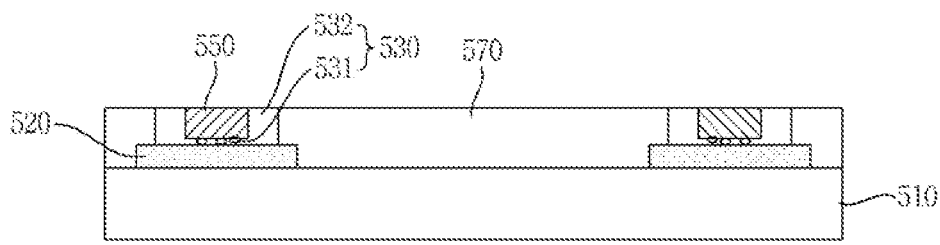

DISPLAY APPARATUS USING SEMICONDUCTOR LIGHT EMITTING DEVICE

CROSS REFERENCE TO RELATED APPLICATIONS

This application is the National Stage filing under 35 U.S.C. 371 of International Application No. PCT/KR2020/001185, filed on Jan. 23, 2020, which claims the benefit of earlier filing date and right of priority to Korean Application No. 10-2019-0157438, filed on Nov. 29, 2019, the contents of all these applications are hereby incorporated by reference herein in their entirety.

TECHNICAL FIELD

The present invention relates to a display device and a method for manufacturing the same, and more particularly, to a display device using a semiconductor light emitting device having a size of several μm to several tens of μm, and a method for manufacturing the same.

BACKGROUND ART

Recently, in the field of display technology, display devices having excellent characteristics such as thinness and flexibility have been developed. In contrast, currently commercialized major displays are represented by LCD (Liquid Crystal Display) and AMOLED (Active-Matrix Organic Light Emitting Diodes).

Meanwhile, Light Emitting Diode (LED) is a well-known semiconductor light emitting device that converts electric current into light. LED has been used as a light source for display images of electronic devices including information and communication devices. Accordingly, a method for solving the above problems by implementing a flexible display using the semiconductor light emitting device can be proposed.

The semiconductor light emitting device is transferred onto the substrate in various ways. As one of the transfer methods of semiconductor light emitting devices, a transfer method using an anisotropic conductive layer is used. The use of the anisotropic conductive layer has an advantage in that the semiconductor light emitting device and the wiring electrode can be electrically connected only by thermal compression, but there is a problem in that poor contact between the semiconductor light emitting device and the wiring electrode occurs when the area of the wiring substrate increases.

DISCLOSURE

Technical Problem

One object of the present invention is to provide a structure and a manufacturing method for preventing contact failure between a semiconductor light emitting device and a wiring electrode when the semiconductor light emitting device is pressed to a wiring electrode using an anisotropic conductive layer.

Also, another object of the present invention is to provide a structure and a manufacturing method for transferring semiconductor light emitting devices directly from a growth substrate to a wiring substrate and transferring semiconductor light emitting devices emitting different colors to a single wiring substrate.

Technical Solution

In order to achieve the above object, the present invention can provide a display device including a substrate, a wiring electrode disposed on the substrate, a plurality of semiconductor light emitting devices electrically connected to the wiring electrode, and an anisotropic conductive layer disposed between the semiconductor light emitting devices and formed of a mixture of conductive particles and an insulating material, and a light-transmitting layer formed between the semiconductor light emitting devices and the plurality of semiconductor light emitting devices including first semiconductor light emitting devices emitting a first color and second semiconductor light emitting devices emitting a second color different from the first color, and the first and second semiconductor light emitting devices being alternately disposed.

In an embodiment, the first semiconductor light emitting device can be arranged in a line on an imaginary plane extending in one direction, and the second semiconductor light emitting device can be disposed not to overlap the imaginary plane.

In an embodiment, the first and second semiconductor light emitting devices can be surrounded by different anisotropic conductive layers.

In an embodiment, the anisotropic conductive layer surrounding the first semiconductor light emitting device can be disposed on the imaginary plane, and the anisotropic conductive layer surrounding the second semiconductor light emitting device can be disposed so as not to overlap the imaginary plane.

In an embodiment, the wiring electrode can include a first region overlapping the anisotropic conductive layer and a second region not overlapping the anisotropic conductive layer.

In an embodiment, conductive particles can be disposed only in a region overlapping the semiconductor light emitting device in the first region.

The present invention also provides a method of manufacturing a display device by transferring a plurality of semiconductor light emitting devices to a substrate on which wiring electrodes are formed. Specifically, the present invention can include a step of forming semiconductor light emitting devices on a growth substrate, a step of forming an anisotropic conductive layer on some of the semiconductor light emitting devices, a step of aligning a substrate on which a wiring electrode is formed with the growth substrate, a step of pressing the growth substrate onto the substrate so that the semiconductor light emitting devices formed on the growth substrate are transferred to the substrate; and a step of removing the growth substrate. The step of forming the anisotropic conductive layer on some of the semiconductor light emitting devices among the semiconductor light emitting devices are characterized in that at least one semiconductor light emitting device on which the anisotropic conductive layer is not formed is disposed between the semiconductor light emitting devices on which the anisotropic conductive layer is formed.

In an embodiment, on the substrate, a first growth substrate on which first semiconductor light emitting devices emitting a first color are formed on the first growth substrate and a second growth substrate on which second semiconductor light emitting devices emitting a second color different from the first color are formed can be pressed at least once, respectively. When the second growth substrate is compressed with the substrate in a state in which the first semiconductor light emitting devices are transferred to the substrate, the second growth substrate and the substrate are aligned so that the second semiconductor light emitting devices on which the anisotropic conductive layer is formed are crossed with the transferred first semiconductor light emitting devices.

Advantageous Effects

In the display device according to the present invention, when the semiconductor light emitting device is pressed onto the wiring substrate, since the flow of the anisotropic conductive layer can be minimized, it is possible to prevent the conductive particles from being separated between the semiconductor light emitting device and the wiring electrode. Through this, the present invention can prevent a contact defect between the semiconductor light emitting device and the wiring electrode from occurring.

In addition, according to the present invention, when the semiconductor light emitting device is pressed onto the wiring substrate, since the buffer unit maintains a constant distance between the semiconductor light emitting device and the wiring electrode, even if the wiring substrate is widened, uniform pressure can be applied to each of the semiconductor light emitting devices.

In addition, according to the present invention, when different types of semiconductor light emitting devices are transferred to one wiring substrate, different types of semiconductor light emitting devices can be transferred without interfering with the previously transferred semiconductor light emitting devices by arranging the semiconductor light emitting devices alternately.

DESCRIPTION OF DRAWINGS

FIG. 1 is a conceptual diagram showing an embodiment of a display device using a semiconductor light emitting device of the present invention.

FIG. 2 is a partially enlarged view of part A of FIG. 1, and FIGS. 3A and 3B are cross-sectional views taken along lines B-B and C-C of FIG. 2.

FIG. 4 is a conceptual diagram illustrating the flip-chip type semiconductor light emitting device of FIG. 3.

FIGS. 5A to 5C are conceptual views illustrating various forms of implementing colors in relation to a flip-chip type semiconductor light emitting device.

FIG. 6 is a cross-sectional view showing a method of manufacturing a display device using the semiconductor light emitting device of the present invention.

FIG. 7 is a perspective view showing another embodiment of a display device using the semiconductor light emitting device of the present invention.

FIG. 8 is a cross-sectional view taken along line C-C in FIG. 7.

FIG. 9 is a conceptual diagram illustrating the vertical semiconductor light emitting device of FIG. 8.

FIGS. 10 and 11 are conceptual views illustrating problems occurring during compression described in FIG. 6.

FIGS. 12 to 16 are conceptual views illustrating a method of manufacturing a display device according to the present invention.

FIG. 17 is a conceptual diagram illustrating semiconductor light emitting devices disposed on a wiring substrate according to the manufacturing method according to the present invention.

FIG. 18 is a conceptual diagram illustrating different types of semiconductor light emitting devices formed on different growth substrates.

FIGS. 19 and 20 are conceptual views illustrating different types of semiconductor light emitting devices being transferred onto one wiring substrate.

FIG. 21 is a cross-sectional view showing a cross section of a display device according to the present invention.

MODE FOR INVENTION

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies can obscure the gist of the embodiments disclosed in the present specification, the detailed description thereof will be omitted. In addition, the attached drawings are only for easy understanding of the embodiments disclosed in the present specification, and should not be construed as limiting the technical idea disclosed herein by the attached drawings.

Also, when an element such as a layer, region or substrate is referred to as being "on" another component, it will be understood that this can be directly on other elements or intervening elements can exist in between.

A display device described in this specification can include a mobile phone, a smart phone, a laptop computer, a digital broadcasting terminal, a personal digital assistant (PDA), a portable multimedia player (PMP), a navigation system, a slate PC, a Tablet PC, an Ultra Book, a digital TV, a digital signage, a head mounted display (HMD), a desktop computer, and the like. However, it will be readily apparent to those skilled in the art that the configuration according to the embodiment described herein can be applied to a display capable device even in a new product form to be developed later.

FIG. 1 is a conceptual diagram showing an embodiment of a display device using a semiconductor light emitting device of the present invention.

As illustrated, information processed by the control unit of the display device 100 can be displayed using a flexible display.

A flexible display includes a display that can be bent, bent, twisted, folded, or rolled by an external force. For example, the flexible display can be a display manufactured on a thin and flexible substrate that can be bent, twisted, folded, or rolled like paper while maintaining the display characteristics of a conventional flat panel display.

In a state in which the flexible display is not bent (for example, a state having an infinite radius of curvature, hereinafter referred to as a first state), the display area of the flexible display becomes a flat surface. In a state bent by an external force in the first state (for example, a state having a finite radius of curvature, hereinafter referred to as a second state), the display area can be a curved surface. As shown, the information displayed in the second state can be visual information output on the curved surface. Such visual information is implemented by independently controlling the light emission of sub-pixels arranged in a matrix form. The unit pixel means a minimum unit for implement one color.

The unit pixel of the flexible display can be implemented by a semiconductor light emitting device. In the present invention, a light emitting diode (LED) is exemplified as a type of semiconductor light emitting device that converts current into light. The light emitting diode is formed to have a small size, so that it can serve as a unit pixel even in the second state.

Hereinafter, a flexible display implemented using the light emitting diode will be described in more detail with reference to the drawings.

FIG. 2 is a partial enlarged view of part A of FIG. 1, FIGS. 3a and 3b are cross-sectional views taken along lines B-B and C-C in FIG. 2. FIG. 4 is a conceptual diagram illustrating the flip chip type semiconductor light emitting device of FIG. 3A, and FIGS. 5A to 5C are conceptual diagrams illustrating various forms of implementing colors in relation to the flip chip type semiconductor light emitting device.

Referring to FIGS. 2, 3A, and 3B, the display device 100 using a semiconductor light emitting device of a passive matrix (PM) method is exemplified as the display device 100 using a semiconductor light emitting device. However, the examples described below are also applicable to an active matrix (AM) type semiconductor light emitting device.

The display device 100 includes a substrate 110, a first electrode 120, a conductive adhesive layer 130, a second electrode 140, and a plurality of semiconductor light-emitting devices 150.

The substrate 110 can be a flexible substrate. For example, to implement a flexible display device, the substrate 110 can include glass or polyimide (PI). In addition, any material such as PEN (polyethylene naphthalate) or PET (polyethylene terephthalate) can be used as long as it has insulating properties and is flexible. Also, the substrate 110 can be made of either a transparent material or an opaque material.

The substrate 110 can be a wiring substrate on which the first electrode 120 is disposed, and thus the first electrode 120 can be located on the substrate 110.

As shown, the insulating layer 160 can be disposed on the substrate 110 on which the first electrode 120 is positioned, and the auxiliary electrode 170 can be positioned on the insulating layer 160. In this case, a state in which the insulating layer 160 is laminated on the substrate 110 can be a single wiring substrate. More specifically, the insulating layer 160 is made of an insulating and flexible material such as polyimide (PI, Polyimide), PET, or PEN, and can be formed integrally with the substrate 110 to form a single substrate.

The auxiliary electrode 170 is an electrode that electrically connects the first electrode 120 and the semiconductor light emitting device 150, and the auxiliary electrode 170 is located on the insulating layer 160, and the auxiliary electrode 170 is disposed to correspond to the position of the first electrode 120. For example, the auxiliary electrode 170 can have a dot shape and can be electrically connected to the first electrode 120 by an electrode hole 171 penetrating the insulating layer 160. The electrode hole 171 can be formed by filling a via hole with a conductive material.

Referring to the drawings, the conductive adhesive layer 130 is formed on one surface of the insulating layer 160, but the present invention is not necessarily limited thereto. For example, a layer performing a specific function can be formed between the insulating layer 160 and the conductive adhesive layer 130, or a structure in which the conductive adhesive layer 130 is disposed on the substrate 110 without the insulating layer 160 is also possible. In a structure in which the conductive adhesive layer 130 is disposed on the substrate 110, the conductive adhesive layer 130 can serve as an insulating layer.

The conductive adhesive layer 130 can be a layer having adhesiveness and conductivity, and for this purpose, a material having conductivity and a material having adhesiveness can be mixed in the conductive adhesive layer 130. In addition, the conductive adhesive layer 130 has ductility, thereby enabling a flexible function in the display device.

For this example, the conductive adhesive layer 130 can be an anisotropic conductive film (ACF), an anisotropic conductive paste, a solution containing conductive particles, or the like. The conductive adhesive layer 130 can be configured as a layer that allows electrical interconnection in the Z direction passing through the thickness, but has electrical insulation in the horizontal X-Y direction. Accordingly, the conductive adhesive layer 130 can be referred to as a Z-axis conductive layer (however, hereinafter referred to as a 'conductive adhesive layer').

The anisotropic conductive film is a film in which an anisotropic conductive medium is mixed with an insulating base member, and when heat and pressure are applied, only a specific portion has conductivity by the anisotropic conductive medium. Hereinafter, it will be described that heat and pressure are applied to the anisotropic conductive film, but other methods are also possible in order for the anisotropic conductive film to have partial conductivity. In this method, for example, only one of the above heat and pressure can be applied or UV curing can be performed.

Also, the anisotropic conductive medium can be, for example, conductive balls or conductive particles. As shown, in this example, the anisotropic conductive film is a film in which conductive balls are mixed with an insulating base member, and when heat and pressure are applied, only a specific portion has conductivity by the conductive balls. The anisotropic conductive film can be in a state in which a core of a conductive material contains a plurality of particles covered by an insulating film made of a polymer material. In this case, the portion to which heat and pressure is applied has conductivity due to the core as the insulating film is destroyed. At this time, the shape of the core can be deformed to form a layer in contact with each other in the thickness direction of the film. As a more specific example, heat and pressure are applied as a whole to the anisotropic conductive film, and an electrical connection in the Z-axis direction is partially formed due to a height difference of an object adhered by the anisotropic conductive film.

As another example, the anisotropic conductive film can be in a state in which an insulating core contains a plurality of particles coated with a conductive material. In this case, the conductive material is deformed (pressed) in the portion to which heat and pressure are applied, and thus has conductivity in the thickness direction of the film. As another example, a form in which the conductive material penetrates the insulating base member in the Z-axis direction to have conductivity in the thickness direction of the film is also possible. In this case, the conductive material can have a pointed end.

As shown, the anisotropic conductive film can be a fixed array anisotropic conductive film (ACF) in which a conductive ball is inserted into one surface of an insulating base member. More specifically, the insulating base member is formed of an adhesive material, the conductive balls are intensively disposed on the bottom portion of the insulating base member, and when heat and pressure are applied from the base member, the conductive balls are deformed together with the conductive balls to have conductivity in the vertical direction.

However, the present invention is not necessarily limited thereto. The anisotropic conductive film can have a form in which conductive balls are randomly mixed in an insulating base member, or a form in which conductive balls are arranged in one layer (double-ACF), which is composed of a plurality of layers, and the like.

The anisotropic conductive paste is a combination of a paste and a conductive ball, and can be a paste in which a conductive ball is mixed with an insulating and adhesive base material. Also, a solution containing conductive particles can be a solution containing conductive particles or nano-particles.

Referring back to the drawings, the second electrode 140 is spaced apart from the auxiliary electrode 170 and is located in the insulating layer 160. That is, the conductive adhesive layer 130 is disposed on the insulating layer 160 in which the auxiliary electrode 170 and the second electrode 140 are located.

In a state in which the auxiliary electrode 170 and the second electrode 140 are positioned on the insulating layer 160, after forming the conductive adhesive layer 130, when the semiconductor light emitting device 150 is connected in a flip chip shape by applying heat and pressure, the semiconductor light emitting device 150 is electrically connected to the first electrode 120 and the second electrode 140.

Referring to FIG. 4, the semiconductor light emitting device can be a flip chip type light emitting device.

For example, the semiconductor light emitting device includes the p-type electrode 156, the p-type semiconductor layer 155 on which the p-type electrode 156 is formed, the active layer 154 formed on the p-type semiconductor layer 155, the n-type semiconductor layer 153 formed on the active layer 154 and the n-type electrode 152 spaced apart from the p-type electrode 156 in the horizontal direction on the n-type semiconductor layer 153. In this case, the p-type electrode 156 can be electrically connected to the auxiliary electrode 170 and the conductive adhesive layer 130, and the n-type electrode 152 can be electrically connected to the second electrode 140.

Referring back to FIGS. 2, 3A, and 3B, the auxiliary electrode 170 is formed to be elongated in one direction, so that one auxiliary electrode can be electrically connected to the plurality of semiconductor light emitting devices 150. For example, p-type electrodes of left and right semiconductor light emitting devices with respect to the auxiliary electrode can be electrically connected to one auxiliary electrode.

More specifically, the semiconductor light emitting device 150 is press-fitted into the conductive adhesive layer 130 by heat and pressure. Through this, only the portion between the p-type electrode 156 and the auxiliary electrode 170 of the semiconductor light emitting device 150 and the portion between the n-type electrode 152 and the second electrode 140 of the semiconductor light emitting device 150 have conductivity, and there is no press-fitting of the semiconductor light emitting device, so it does not have conductivity in the remaining part.

In addition, the plurality of semiconductor light emitting devices 150 constitute a light emitting device array, and the phosphor layer 180 is formed on the light emitting device array.

The light emitting device array can include a plurality of semiconductor light emitting devices having different luminance values. Each semiconductor light emitting device 150 constitutes a unit pixel and is electrically connected to the first electrode 120. For example, the first 120 can be plurality, the semiconductor light emitting devices are arranged in, for example, several rows, and the semiconductor light emitting devices in each column can be electrically connected to any one of the plurality of first electrodes.

Also, since the semiconductor light emitting devices are connected in a flip-chip form, semiconductor light emitting devices grown on a transparent dielectric substrate can be used. In addition, the semiconductor light emitting devices can be, for example, nitride semiconductor light emitting devices. Since the semiconductor light emitting device 150 has excellent luminance, individual unit pixels can be configured even with a small size.

As shown, the barrier walls 190 can be formed between the semiconductor light emitting devices 150. In this case, the barrier wall 190 can serve to separate individual unit pixels from each other, and can be integrally formed with the conductive adhesive layer 130. For example, by inserting the semiconductor light emitting device 150 into the anisotropic conductive film, the base member of the anisotropic conductive film can form the barrier wall.

In addition, when the base member of the anisotropic conductive film is black, the barrier wall 190 can have reflective properties and increase contrast even without a separate black insulator.

As another example, a reflective barrier wall can be separately provided as the barrier wall 190. In this case, the barrier wall 190 can include a black or white insulator depending on the purpose of the display device. When the barrier wall made of a white insulator are used, reflectivity can be increased, and when the barrier walls made of a black insulator are used, it is possible to have reflective properties and increase contrast.

The phosphor layer 180 can be located on the outer surface of the semiconductor light emitting device 150. For example, the semiconductor light emitting device 150 is a blue semiconductor light emitting device that emits blue (B) light, and the phosphor layer 180 performs a function of converting the blue (B) light into the color of a unit pixel. The phosphor layer 180 can be a red phosphor 181 or a green phosphor 182 constituting an individual pixel.

That is, a red phosphor 181 capable of converting blue light into red (R) light can be stacked on the blue semiconductor light emitting device 151 at a position constituting the red unit pixel, a green phosphor 182 capable of converting blue light into green (G) light can be stacked on the blue semiconductor light emitting device 151 at a position forming the green unit pixel. In addition, only the blue semiconductor light emitting device 151 can be used alone in the portion constituting the blue unit pixel. In this case, unit pixels of red (R), green (G), and blue (B) can form one pixel. More specifically, a phosphor of one color can be stacked along each line of the first electrode 120. Accordingly, one line in the first electrode 120 can be an electrode for controlling one color. That is, red (R), green (G), and blue (B) can be sequentially disposed along the second electrode 140, thereby a unit pixel can be implemented.

However, the present invention is not necessarily limited thereto, instead of the phosphor, the semiconductor light emitting device 150 and the quantum dot (QD) are combined to implement unit pixels of red (R), green (G), and blue (B).

In addition, a black matrix 191 can be disposed between each of the phosphor layers to improve contrast. That is, the black matrix 191 can improve contrast of light and dark.

However, the present invention is not necessarily limited thereto, and other structures for implementing blue, red, and green colors can be applied.

Referring to FIG. 5A, each semiconductor light emitting device 150 is mainly made of gallium nitride (GaN), and indium (In) and/or aluminum (Al) is added together to be implemented as a high power light emitting device that emits various light including blue.

In this case, the semiconductor light emitting device 150 can be a red, green, and blue semiconductor light emitting device to form a sub-pixel, respectively. For example, red, green, and blue semiconductor light emitting devices R, G, and B are alternately disposed, and unit pixels of red, green, and blue colors by the red, green and blue semiconductor light emitting devices can form one pixel. Through this, a full color display can be implemented.

Referring to FIG. 5B, the semiconductor light emitting device can include a white light emitting device W in which a yellow phosphor layer is provided for each device. In this case, a red phosphor layer 181, a green phosphor layer 182, and a blue phosphor layer 183 can be provided on the white light emitting device W to form a unit pixel. In addition, a unit pixel can be formed on the white light emitting device W by using a color filter in which red, green, and blue are repeated.

Referring to FIG. 5C, a structure in which a red phosphor layer 181, a green phosphor layer 182, and a blue phosphor layer 183 are provided on the ultraviolet light emitting device UV is also possible. In this way, the semiconductor light emitting device can be used in the entire region not only for visible light but also for ultraviolet (UV) light, and can be extended in the form of a semiconductor light emitting device in which ultraviolet (UV) can be used as an excitation source of the upper phosphor.

Referring back to this example, the semiconductor light emitting device 150 is positioned on the conductive adhesive layer 130 to constitute a unit pixel in the display device. Since the semiconductor light emitting device 150 has excellent luminance, individual unit pixels can be configured even with a small size. The size of the individual semiconductor light emitting device 150 can have a side length of 80 μm or less, and can be a rectangular or square device. In the case of a rectangle, the size can be 20×80 μm or less.

In addition, even when a square semiconductor light emitting device 150 having a side length of 10 μm is used as a unit pixel, sufficient brightness to form a display device appears. Accordingly, for example, when the unit pixel is a rectangular pixel having one side of 600 μm and the other side of 300 μm, the distance between the semiconductor light emitting devices is relatively large. Accordingly, in this case, it is possible to implement a flexible display device having HD image quality.

The display device using the semiconductor light emitting device described above can be manufactured by a new type of manufacturing method. Hereinafter, the manufacturing method will be described with reference to FIG. 6.

FIG. 6 is a cross-sectional view illustrating a method of manufacturing a display device using a semiconductor light emitting device of the present invention.

Referring to this figure, first, the conductive adhesive layer 130 is formed on the insulating layer 160 on which the auxiliary electrode 170 and the second electrode 140 are positioned. An insulating layer 160 is laminated on the first substrate 110 to form one substrate (or wiring board), and the wiring substrate includes a first electrode 120, an auxiliary electrode 170, and a second electrode 140. In this case, the first electrode 120 and the second electrode 140 may be disposed in a mutually orthogonal direction. In addition, in order to implement a flexible display device, the first substrate 110 and the insulating layer 160 may each include glass or polyimide (PD).

The conductive adhesive layer 130 can be implemented by, for example, an anisotropic conductive film, and for this purpose, the anisotropic conductive film can be applied to the substrate on which the insulating layer 160 is located.

Next, the second substrate 112 is provided with a plurality of semiconductor light emitting devices 150 corresponding to the positions of the auxiliary electrode 170 and the second electrodes 140 and constituting the individual pixels, and the second substrate 112 is disposed such that the semiconductor light emitting device 150 faces the auxiliary electrode 170 and the second electrode 140.

In this case, the second substrate 112 is a growth substrate on which the semiconductor light emitting device 150 is grown, and can be a sapphire substrate or a silicon substrate.

When the semiconductor light emitting device is formed in units of wafers, the semiconductor light emitting device can be effectively used in a display device by having an interval and a size that can form a display device.

Next, the wiring substrate and the second substrate 112 are thermal compressed. For example, the wiring substrate and the second substrate 112 can be thermal compression by applying an ACF press head. The wiring substrate and the second substrate 112 are bonded by the thermal compression. By thermal compression, only a portion between the semiconductor light emitting device 150 and the auxiliary electrode 170 and the second electrode 140 has conductivity due to the properties of the anisotropic conductive film having conductivity. Through this, the electrodes and the semiconductor light emitting device 150 can be electrically connected. At this time, the semiconductor light emitting device 150 is inserted into the anisotropic conductive film, and through this, a barrier wall can be formed between the semiconductor light emitting devices 150.

Next, the second substrate 112 is removed. For example, the second substrate 112 can be removed using a laser lift-off (LLO) method or a chemical lift-off (CLO) method.

Finally, the second substrate 112 is removed to expose the semiconductor light emitting devices 150 to the outside. If necessary, a transparent insulating layer (not shown) can be formed by coating silicon oxide (SiOx) or the like on the wiring substrate to which the semiconductor light emitting device 150 is coupled.

In addition, the method can further include forming a phosphor layer on one surface of the semiconductor light emitting device 150. For example, the semiconductor light emitting device 150 is a blue semiconductor light emitting device that emits blue (B) light. And a red phosphor or a green phosphor for converting the blue (B) light into the color of the unit pixel can form a layer on one surface of the blue semiconductor light emitting device.

The manufacturing method or structure of the display device using the semiconductor light emitting device described above can be modified in various forms. As an example, a vertical semiconductor light emitting device can also be applied to the display device described above. Hereinafter, a vertical structure will be described with reference to FIGS. 5 and 6.

In addition, in the modification or embodiment described below, the same or similar reference numerals are assigned to the same or similar components as in the previous example, and the description is replaced with the first description.

FIG. 7 is a perspective view showing another embodiment of the display device using the semiconductor light emitting device of the present invention, FIG. 8 is a cross-sectional view taken along line C-C of FIG. 7, and FIG. 9 is a conceptual view illustrating the vertical semiconductor light emitting device of FIG. 8.

Referring to the drawings, the display device can be a display device using a passive matrix (PM) type vertical semiconductor light emitting device.

The display device includes a substrate 210, a first electrode 220, a conductive adhesive layer 230, a second electrode 240, and a plurality of semiconductor light emitting devices 250.

The substrate 210 is a wiring substrate on which the first electrode 220 is disposed, and can include polyimide (PI) to implement a flexible display device. In addition, any material that has insulating properties and is flexible can be used.

The first electrode 220 can be positioned on the substrate 210, and can be formed as a bar-shaped electrode long in one direction. The first electrode 220 can serve as a data electrode.

The conductive adhesive layer 230 is formed on the substrate 210 on which the first electrode 220 is located. Like a display device to which a flip chip type light emitting device is applied, the conductive adhesive layer 230 can be an anisotropic conductive film (ACF), an anisotropic conductive paste, a solution containing conductive particles, or the like. However, in this embodiment as well, a case in which the conductive adhesive layer 230 is implemented by an anisotropic conductive film is exemplified.

After positioning the anisotropic conductive film in a state in which the first electrode 220 is positioned on the substrate 210, when the semiconductor light emitting device 250 is connected by applying heat and pressure, the semiconductor light emitting device 250 is electrically connected to the first electrode 220. In this case, the semiconductor light emitting device 250 is preferably disposed on the first electrode 220.

As described above, when heat and pressure are applied to the anisotropic conductive film, the electrical connection is partially generated because it has conductivity in the thickness direction. Accordingly, the anisotropic conductive film is divided into a conductive portion and a non-conductive portion in the thickness direction.

In addition, since the anisotropic conductive film contains an adhesive component, the conductive adhesive layer 230 implements not only electrical connection but also mechanical bonding between the semiconductor light emitting device 250 and the first electrode 220.

As describe above, the semiconductor light emitting device 250 is positioned on the conductive adhesive layer 230, and through this, constitutes an individual pixel in the display device. Since the semiconductor light emitting device 250 has excellent luminance, individual unit pixels can be configured even with a small size. The size of the individual semiconductor light emitting device 250 can have a side length of 80 µm or less, and can be a rectangular or square device. In the case of a rectangle, the size can be 20×80 µm or less.

The semiconductor light emitting device 250 can have a vertical structure.

Between the vertical semiconductor light emitting devices, a plurality of second electrodes 240 are disposed in a direction crossing the longitudinal direction of the first electrode 220 and electrically connected to the vertical semiconductor light emitting device 250.

Referring to FIG. 9, such a vertical semiconductor light emitting device includes a p-type electrode 256, a p-type semiconductor layer 255 formed on the p-type electrode 256, an active layer 254 formed on the p-type semiconductor layer 255, an n-type semiconductor layer 253 formed on the active layer 254 and an n-type electrode 252 formed on the n-type semiconductor layer 253. In this case, the lower p-type electrode 256 can be electrically connected to the first electrode 220 and the conductive adhesive layer 230, and the n-type electrode 252 located on the upper portion can be electrically connected to a second electrode 240 to be described later. The vertical semiconductor light emitting device 250 has a great advantage in that it is possible to reduce the size of a chip because electrodes can be arranged up and down.

Referring back to FIG. 8, a phosphor layer 280 can be formed on one surface of the semiconductor light emitting device 250. For example, the semiconductor light emitting device 250 can be a blue semiconductor light emitting device 251 emitting blue (B) light, and a phosphor layer 280 for converting the blue (B) light into the color of a unit pixel can be provided. In this case, the phosphor layer 280 can be a red phosphor 281 and a green phosphor 282 constituting individual pixels.

That is, a red phosphor 281 capable of converting blue light into red (R) light can be stacked on the blue semiconductor light emitting device 251 at a position forming the red unit pixel. And a green phosphor 282 capable of converting blue light into green (G) light can be stacked on the blue semiconductor light emitting device 251 at a position forming the green unit pixel. In addition, only the blue semiconductor light emitting device 251 can be used alone in a portion constituting the blue unit pixel. In this case, unit pixels of red (R), green (G), and blue (B) can form one pixel.

However, the present invention is not necessarily limited thereto, and as described above in a display device to which a flip chip type light emitting device is applied, other structures for implementation blue, red, and green can be applied.

Referring to this embodiment again, the second electrode 240 is positioned between the semiconductor light emitting devices 250 and is electrically connected to the semiconductor light emitting devices 250. For example, the semiconductor light emitting devices 250 can be arranged in a plurality of columns, and the second electrode 240 can be positioned between the columns of the semiconductor light emitting devices 250.

Since the distance between the semiconductor light emitting devices 250 constituting individual pixels is sufficiently large, the second electrode 240 can be positioned between the semiconductor light emitting devices 250.

The second electrode 240 can be formed as a long bar-shaped electrode in one direction, and can be disposed in a direction perpendicular to the first electrode.

In addition, the second electrode 240 and the semiconductor light emitting device 250 can be electrically connected to each other by a connection electrode protruding from the second electrode 240. More specifically, the connection electrode can be an n-type electrode of the semiconductor light emitting device 250. For example, the n-type electrode is formed as an ohmic electrode for ohmic contact, and the second electrode covers at least a portion of the ohmic electrode by printing or deposition. Through this, the second electrode 240 and the n-type electrode of the semiconductor light emitting device 250 can be electrically connected.

As shown, the second electrode 240 can be positioned on the conductive adhesive layer 230. In some cases, a transparent insulating layer (not shown) including silicon oxide (SiOx) can be formed on the substrate 210 on which the semiconductor light emitting device 250 is formed. When the second electrode 240 is positioned after the transparent insulating layer is formed, the second electrode 240 is positioned on the transparent insulating layer. In addition, the second electrode 240 can be formed to be spaced apart from the conductive adhesive layer 230 or the transparent insulating layer.

If a transparent electrode such as indium tin oxide (ITO) is used to position the second electrode 240 on the semiconductor light emitting device 250, the ITO material has a problem of poor adhesion to the n-type semiconductor layer. Accordingly, the present invention has the advantage of not using a transparent electrode such as ITO by locating the second electrode 240 between the semiconductor light emitting devices 250. Therefore, it is possible to improve light extraction efficiency by using a conductive material having good adhesion to the n-type semiconductor layer as a horizontal electrode without being limited by the selection of a transparent material.

As shown, a barrier wall 290 can be positioned between the semiconductor light emitting devices 250. That is, a barrier wall 290 can be disposed between the vertical semiconductor light emitting devices 250 to isolate the semiconductor light emitting devices 250 constituting individual pixels. In this case, the barrier wall 290 can serve to separate individual unit pixels from each other, and can be integrally formed with the conductive adhesive layer 230. For example, by inserting the semiconductor light emitting device 250 into the anisotropic conductive film, the base member of the anisotropic conductive film can form the barrier wall.

In addition, if the base member of the anisotropic conductive film is black, even without a separate black insulator, the barrier wall 290 can have a reflective characteristic and a contrast ratio can be increased.

As another example, as the barrier wall 190, a reflective barrier wall can be separately provided. The barrier wall 290 can include a black or white insulator depending on the purpose of the display device.

If the second electrode 240 is directly positioned on the conductive adhesive layer 230 between the semiconductor light emitting devices 250, the barrier wall 290 can be positioned between the vertical semiconductor light emitting device 250 and the second electrode 240. Accordingly, there is a technical effect that individual unit pixels can be configured even with a small size by using the semiconductor light emitting device 250, since the distance between the semiconductor light emitting devices 250 is relatively large enough, the second electrode 240 can be positioned between the semiconductor light emitting devices 250, and there is a technical effect that a flexible display device having HD image quality can be implemented.

Also, as shown, a black matrix 291 can be disposed between each phosphor in order to improve a contrast ratio. That is, the black matrix 291 can improve contrast of light and dark.

As described above, the semiconductor light emitting device 250 is positioned on the conductive adhesive layer 230 and constitutes individual pixels in the display device through this. Since the semiconductor light emitting device 250 has excellent luminance, individual unit pixels can be configured even with a small size. Accordingly, a full-color display in which unit pixels of red (R), green (G), and blue (B) constitute one pixel can be implemented by the semiconductor light emitting device.

An anisotropic conductive film (ACF) is utilized in the display device described above. The anisotropic conductive film (hereinafter, anisotropic conductive layer) can be made of a mixture of conductive balls (hereinafter, conductive particles) and an insulating material. As described in FIG. 6, when the substrate on which the semiconductor light emitting device is formed is thermal compressed on the wiring substrate coated with the anisotropic conductive layer, the wiring electrode and the semiconductor light emitting device are electrically connected by conductive particles.

During thermal compression, the conductive particles are compressed between the semiconductor light emitting device and the wiring electrode to electrically connect the semiconductor light emitting device and the wiring electrode. In order to electrically connect the semiconductor light emitting device and the wiring electrode, a certain level of pressure or more should be applied to the conductive particles.

Referring to FIG. 10, due to fluidity of the anisotropic conductive layer 330 during thermal compression, poor contact between the semiconductor light emitting device 350 and the wiring electrode 320 can occur. Specifically, during thermal compression, the conductive particles 331 should be located between the semiconductor light emitting device 350 and the wiring electrode 320, but the conductive particles 331 do not stay between the semiconductor light emitting device 350 and the wiring electrode 320 and can move due to external pressure. In this case, the semiconductor light emitting device 350 and the wiring electrode 320 are incompletely electrically connected.

Meanwhile, referring to FIG. 11, as the area of the wiring substrate 310 increases, the pressure applied to each area of the wiring substrate 110 during thermal compression becomes non-uniform. Specifically, when the area of the wiring substrate is large, a relatively high pressure is applied to the edge region of the wiring substrate, and a relatively low pressure is applied to the central region of the wiring substrate. For this reason, in the edge region of the wiring substrate, the conductive particles are completely pressed to the wiring electrode and the semiconductor light emitting device, but in the central region of the wiring substrate, sufficient pressure is not applied to the conductive particles, resulting in poor contact between the wiring electrode and the semiconductor light emitting device.

On the other hand, when the semiconductor light emitting device is directly transferred from the growth substrate to the wiring substrate, the anisotropic conductive layer formed on the wiring substrate or the growth substrate can interfere with the transfer of the semiconductor light emitting device. Specifically, an anisotropic conductive layer (hereinafter, first anisotropic conductive layer) for fixing a semiconductor light emitting device that emits light of a first color (hereinafter, a first semiconductor light emitting device) and an anisotropic conductive layer (hereinafter, a second anisotropic conductive layer) for fixing a semiconductor light emitting device (hereinafter, referred to as a second semiconductor light emitting device) emitting light of a second color different from the first color can be formed on the wiring substrate.

The first growth substrate on which the first semiconductor light emitting device is formed and the second growth substrate on which the second semiconductor light emitting device is formed should be alternately pressed onto the wiring substrate. When the first growth substrate is pressed against the wiring substrate, the second anisotropic conductive layer can come into contact with the first semiconductor light emitting device formed on the first growth substrate, so that the first semiconductor light emitting device can be transferred to an unwanted position. For the above reasons, it is very difficult to directly transfer the semiconductor light emitting device from the growth substrate to the wiring substrate.

The present invention can provide a structure and method for transferring semiconductor light emitting devices directly from a growth substrate to a wiring substrate, and transferring semiconductor light emitting devices emitting different colors to a single wiring substrate.

First, a method for manufacturing a display device according to the present invention will be described.

FIGS. 12 to 16 are conceptual views illustrating a method of manufacturing a display device according to the present invention.

First, a step of forming an anisotropic conductive layer on some of the plurality of semiconductor light emitting devices 350 formed on the growth substrate W is performed.

The growth substrate W is a wafer on which the semiconductor light emitting device 350 is formed. In the present invention, a semiconductor light emitting device is formed in at least a partial region L of the growth substrate W, and an anisotropic conductive layer can be formed on the semiconductor light emitting device 350. The forming of the anisotropic conductive layer can be performed in three different ways.

First, referring to FIG. 13, the step of forming the anisotropic conductive layer 330 can be performed by applying a mixture of a light-transmitting resin 332 and conductive particles 331 on a transfer substrate. At this time, the mixture is applied in a certain pattern.

Second, referring to FIG. 14, the step of forming of the anisotropic conductive layer 330 can be performed by coating the conductive particles 331 on the entire growth substrate W and then applying the light-transmitting resin 332 in a predetermined pattern. Since only the conductive particles 331 at the position where the light-transmitting resin 332 is applied are fixed, only the area where the light-transmitting resin 332 is applied can serve as the anisotropic conductive layer 330.

Third, referring to FIG. 15, the forming of the anisotropic conductive layer 330 can be performed by selectively applying the light-transmitting resin 332 only to the area where the conductive particles 331 are applied, after applying the conductive particles 331 to the growth substrate (W) in a certain pattern. In this case, the amount of the conductive particles 331 applied on the growth substrate W can be reduced.

The step of applying the conductive particles, the light-transmitting resin, and the mixture can be performed by screen printing, but is not limited thereto.

According to the method described above, an anisotropic conductive layer of a certain pattern is formed. Specifically, a plurality of the anisotropic conductive layers are formed to be spaced apart from each other, and each of the anisotropic conductive layers is formed to surround the semiconductor light emitting device. At this time, at least one semiconductor light emitting device not surrounded by the anisotropic conductive layer is disposed between the semiconductor light emitting devices surrounded by the anisotropic conductive layer.

The semiconductor light emitting devices are formed in an array form on the growth substrate, and the anisotropic conductive layer is formed only on some semiconductor light emitting devices at regular intervals. A spacing between the anisotropic conductive layers can match a spacing between pixels included in the display device. For example, referring back to FIG. 12, the anisotropic conductive layer cannot be formed on the semiconductor light emitting device 350 surrounded by the anisotropic conductive layer 330 and the two semiconductor light emitting devices adjacent thereto. A semiconductor light emitting device on which an anisotropic conductive layer is not formed is not transferred to a substrate on which a wiring electrode, which will be described later is formed.

Referring to FIG. 16, after the anisotropic conductive layer 330 is formed, aligning the substrate 310 on which the wiring electrode 320 is formed with the growth substrate W and pressing the growth substrate W on the substrate 310 are performed.

When aligning the substrate 310 and the growth substrate W, the wiring electrode 320 and the semiconductor light emitting device 350 surrounded by the anisotropic conductive layer 330 should overlap each other. When the two substrates are pressed, the anisotropic conductive layer 330 surrounding the semiconductor light emitting device 350 should be in contact with the wiring electrode 320 so that the anisotropic conductive layer 330 can electrically connect the semiconductor light emitting device 350 to the wiring electrode 320 and the semiconductor light emitting device 350 can be strongly fixed on the substrate.

Since the anisotropic conductive layer 330 according to the present invention is formed to have a very thin thickness, the anisotropic conductive layer 330 does not significantly flow during the compression process. In the compression step, a portion of the anisotropic conductive layer 330 can flow, but since most of the empty space 360 is between the semiconductor light emitting devices 350 and the wiring electrode 320, the anisotropic conductive layer 330 flows into the empty space. Through this, the present invention allows the pressure to be uniformly applied to the entire area of the substrate 310 during the compression process.

In the compression step, the conductive particles 331 are compressed to electrically connect the semiconductor light emitting device 350 and the wiring electrode 320. According to the present invention, since the flow of the anisotropic conductive layer 330 is minimized, the possibility that the conductive particles 331 deviate from a position between the semiconductor light emitting device 350 and the wiring electrode 320 in the pressing step is very low.

Meanwhile, the anisotropic conductive layer 330 is not formed on a portion of the semiconductor light emitting device 350 disposed on the transfer substrate W. The semiconductor light emitting device on which the anisotropic conductive layer is not formed is not transferred to the substrate 310. As described above, according to the present invention, by selectively forming the anisotropic conductive layer on only some of the plurality of semiconductor light emitting devices, some of the semiconductor light emitting devices disposed on the transfer substrate W can be selectively transferred.

In this process, the semiconductor light emitting devices are arranged in a line on an imaginary plane formed along one direction.

FIG. 17 is a conceptual diagram illustrating semiconductor light emitting devices disposed on a wiring substrate according to a manufacturing method according to the present invention.

Referring to FIG. 17, an imaginary plane (a) is a plane formed along a direction in which a semiconductor light emitting device is disposed.

Specifically, the imaginary plane (a) can have a rectangular shape, and the horizontal length of the rectangle can be the same as the length of the display panel, and the vertical length can be the same as the width of the semiconductor light emitting device 450 surrounded by the anisotropic conductive layer 430. That is, the imaginary plane (a) is defined by the semiconductor light emitting devices 450 arranged in a row. Since a process error can occur during the transfer process, the semiconductor light emitting devices 450 arranged in a line can be displaced by the process error. In this case, the imaginary plane (a) is defined as a rectangle with a minimum width that can overlap both the semiconductor light emitting device and the anisotropic conductive layer surrounding the semiconductor light emitting device that are displaced by a process error. As the process error increases, the area of the imaginary plane can increase.

Meanwhile, a plurality of the imaginary planes can exist. For example, the imaginary plane can have a shape extending in the horizontal direction of the display panel, and the same number of pixels can exist in the vertical direction of the display panel. Semiconductor light emitting devices are arranged in a line on each imaginary plane, and constitute sub-pixels extending in the horizontal direction. In this case, a region (b) in which an additional semiconductor light emitting device can be disposed is formed between the two imaginary planes (a).

Meanwhile, the display device according to the present invention includes a plurality of semiconductor light emitting devices that emit light of different colors. In one embodiment, the display device according to the present invention can include a semiconductor light emitting device that emits blue, red, and green light.

FIG. 18 is a conceptual diagram illustrating different types of semiconductor light emitting devices formed on different growth substrates, and FIGS. 19 and 20 are conceptual diagrams illustrating different types of semiconductor light emitting devices transferred to a single wiring substrate.

In order to transfer a plurality of semiconductor light emitting devices emitting different colors to a display device, different types of semiconductor light emitting devices should be transferred at least once on a wiring substrate. For example, referring to FIG. 18, in order to manufacture a display device including the first to third semiconductor light emitting devices 350a to 350c, a first growth substrate W1 on which a first semiconductor light emitting device 350a is formed on a wiring substrate, the second growth substrate W2 on which the second semiconductor light emitting device 350b is formed, and the third growth substrate W3 on which the third semiconductor light emitting device 350c is formed should be compressed at least once each.

As described above, when a plurality of growth substrates are used for transfer, the anisotropic conductive layer should be formed for each growth substrate. In an embodiment, when the first to third growth substrates are used for transfer, the anisotropic conductive layers 330a to 330c should be formed on each of the first to third growth substrates W1 to W3. Thereafter, the first to third growth substrates W1 to W3 are sequentially pressed onto the wiring substrate.

After pressing the first growth substrate to the wiring substrate, the first semiconductor light emitting devices 450a are arranged in a line on the imaginary plane (a), and the second semiconductor light emitting devices 450b are arranged so as not to overlap the imaginary plane. Accordingly, the second semiconductor light emitting device 450b is disposed in the region (b). Specifically, after transferring the first semiconductor light emitting device 450a onto the wiring substrate, the second semiconductor light emitting device 450b is transferred to the wiring substrate by pressing the second growth substrate to the wiring substrate. When the second growth substrate and the wiring substrate are aligned, the second semiconductor light emitting device on which the anisotropic conductive layer is formed does not overlap the imaginary plane. Also, the anisotropic conductive layer 430b formed on the second semiconductor light emitting device 450b should not overlap the imaginary plane.

Accordingly, the second semiconductor light emitting device 450b transferred to the wiring substrate and the anisotropic conductive layer 430b surrounding the second semiconductor light emitting device 450b do not overlap the imaginary plane (a).

Meanwhile, when there are a plurality of imaginary planes, the second semiconductor light emitting devices 450b can be disposed between the plurality of imaginary planes (a). As the process error during the transfer of the first semiconductor light emitting device 450a increases, the area of the imaginary plane (a) increases, and the position at which the second semiconductor light emitting device 450b can be transferred can decrease.

Meanwhile, referring to FIG. 20, when three types of semiconductor light emitting devices are transferred to one wiring substrate, the first and third semiconductor light emitting devices 450a and 450c and the anisotropic conductive layers 430a and 430c surrounding the first and third semiconductor light emitting devices 450a and 450c are disposed on an imaginary plane (a). And the second semiconductor light emitting device 450b and the anisotropic conductive layer 430b surrounding the second semiconductor light emitting device 450b can be disposed in a region b between two imaginary planes a.

Meanwhile, when a semiconductor light emitting device is transferred using a plurality of growth substrates, the step of removing the growth substrate can be performed for each growth substrate.

As described above, in the present invention, when transferring different types of semiconductor light emitting devices to one wiring substrate, by disposing the semiconductor light emitting devices alternately with each other, different types of semiconductor light emitting devices can be transferred without interference from the previously transferred semiconductor light emitting devices.

Hereinafter, the display device manufactured by the above-described method will be described.

FIG. 21 is a cross-sectional view showing a cross section of a display device according to the present invention.

Referring to FIG. 21, the conductive particles 531 positioned between the semiconductor light emitting device 550 and the wiring electrode 520 can electrically connect the semiconductor light emitting device 550 and the wiring electrode 520 in a compressed state.

Meanwhile, the light-transmitting layer 570 can be formed between the wiring electrodes 520 and between the semiconductor light emitting devices 550. In addition, the light-transmitting layer 570 is formed up to the height of the semiconductor light emitting device 550 to planarize the substrate 510 to which the semiconductor light emitting device 550 is transferred. The light-transmitting layer 570 can be formed on a wiring substrate after all the semiconductor light emitting devices are transferred.

The anisotropic conductive layer 530 is made of a plurality, and any one of the plurality of anisotropic conductive layers spaced apart from each other can be formed to surround the single semiconductor light emitting device 550.

On the other hand, the anisotropic conductive layer 530 can be formed to surround each side of the semiconductor light emitting device (550). Light emitted from the semiconductor light emitting device 550 passes through the anisotropic conductive layer and is emitted to the outside.

Meanwhile, the wiring electrode 520 can include a first region overlapping the anisotropic conductive layer and a second region not overlapping the anisotropic conductive layer. The semiconductor light emitting devices 550 are electrically connected to the wiring electrodes 520 formed in a line shape at regular intervals. Since the anisotropic conductive layer is formed only at the position where the semiconductor light emitting device 550 is disposed, the remaining regions of the wiring electrode 520 except for the region connected to the semiconductor light emitting device 550 can do not overlap the anisotropic conductive layer.

On the other hand, since the anisotropic conductive layer is formed on the growth substrate and then compressed on the wiring electrode, among the first regions, conductive particles are disposed only in a region overlapping the semiconductor light emitting device, and conductive particles are not disposed in one region of the wiring electrode that does not overlap the semiconductor light emitting device.

Meanwhile, a second region that does not overlap the anisotropic conductive layer among the entire region of the wiring electrode 520 overlaps the light-transmitting layer 570.

The display device using the semiconductor light emitting device described above is not limited to the configuration and method of the embodiments described above, the above embodiments can be configured by selectively combining all or part of each of the embodiments so that various modifications can be made.

The invention claimed is:

1. A display device comprising:
   a wiring electrode disposed on a substrate;
   a plurality of semiconductor light emitting devices electrically connected to the wiring electrode;
   an anisotropic conductive layer disposed between the plurality of semiconductor light emitting devices and formed of a mixture of conductive particles and an insulating material; and
   a light-transmitting layer formed between the plurality of semiconductor light emitting devices,
   wherein the plurality of semiconductor light emitting devices comprise first semiconductor light emitting devices emitting a first color and second semiconductor light emitting devices emitting a second color different from the first color,
   wherein the first and second semiconductor light emitting devices are alternately disposed on the substrate,
   wherein each of the first semiconductor light emitting devices is arranged in a first area (a) extending in a first direction,
   wherein each of the second semiconductor light emitting devices is arranged in a second area (b) extending in the first direction,
   wherein the first area (a) and the second area (b) are alternately disposed,
   wherein each the second semiconductor light emitting device and each the first semiconductor light emitting device are configured to not overlap each other in a horizontal direction, and
   wherein the second area (b) is located between a plurality of first areas (a).

2. The display device according to claim 1, wherein the first and second semiconductor light emitting devices are respectively surrounded by a plurality of anisotropic conductive layers, respectively.

3. The display device according to claim 2, wherein a first anisotropic conductive layer surrounding the first semiconductor light emitting devices among the plurality of anisotropic layers is disposed on the first area (a), and
   wherein a second anisotropic conductive layer surrounding the second semiconductor light emitting devices among the plurality of anisotropic layer is not disposed on the first area (a).

4. The display device according to claim 3, wherein the plurality of semiconductor light emitting devices comprise third semiconductor light emitting devices emitting a third color different from the first and second colors, and
   wherein the third semiconductor light emitting devices are disposed so as to overlap the first area (a).

5. The display device according to claim 4, wherein the plurality of anisotropic conductive layers surrounding the third semiconductor light emitting devices are disposed so as to overlap the first area (a).

6. The display device according to claim 1, wherein the first area (a) has a rectangular shape and is defined over a portion of the substrate.

7. A display device comprising:
   a wiring electrode disposed on a substrate;
   a plurality of semiconductor light emitting devices electrically connected to the wiring electrode;
   an anisotropic conductive layer disposed between the plurality of semiconductor light emitting devices and formed of a mixture of conductive particles and an insulating material; and
   a light-transmitting layer formed between the plurality of semiconductor light emitting devices,
   wherein the plurality of semiconductor light emitting devices comprise first semiconductor light emitting devices emitting a first color and second semiconductor light emitting devices emitting a second color different from the first color,
   wherein the first and second semiconductor light emitting devices are alternately disposed on the substrate, and
   wherein the wiring electrode comprises:
   a first region overlapping the anisotropic conductive layer; and
   a second region that does not overlap the anisotropic conductive layer.

8. The display device according to claim 7, wherein the conductive particles overlap only the plurality of semiconductor light emitting device in the first region.

9. The display device according to claim 7, wherein a width of the wiring electrode comprising the first region and the second region is greater than that of the anisotropic conductive layer.

10. The display device according to claim 7, wherein the second region of the wiring electrode overlaps the light-transmitting layer.

11. A display device comprising:
    a wiring electrode disposed on a substrate;
    a plurality of semiconductor light emitting devices electrically connected to the wiring electrode, and separated from each other;
    anisotropic conductive layers disposed on at least some of the plurality of semiconductor light emitting devices, respectively;
    a light-transmitting layer located in areas extending between the plurality of semiconductor light emitting devices;
    conductive particles located in the anisotropic conductive layers and not in the light-transmitting layer, wherein the plurality of semiconductor light emitting devices comprise first semiconductor light emitting devices emitting a first color and second semiconductor light emitting devices emitting a second color different from the first color, wherein the first and second semiconductor light emitting devices are alternately disposed on the substrate, wherein the first semiconductor light emitting devices are arranged in a line on an imaginary plane extending in one direction of the substrate, wherein the second semiconductor light emitting devices are disposed on the substrate so as not to overlap the imaginary plane, and wherein the imaginary plane has a rectangular shape and is defined over a portion of the substrate.

12. The display device according to claim 11, wherein the anisotropic conductive layers include the conductive particles and a resin.

13. The display device according to claim 11, wherein the anisotropic conductive layers extend from at least some of the plurality of semiconductor light emitting devices to the wiring electrodes.

\* \* \* \* \*